(12) United States Patent
Kern

(10) Patent No.: US 6,707,402 B1
(45) Date of Patent: Mar. 16, 2004

(54) METHOD FOR CONVERTING AN ANALOG SIGNAL TO A DIGITAL SIGNAL

(75) Inventor: Otmar Kern, Berlin (DE)

(73) Assignee: Georg Neumann GmbH, Berlin (DE)

(*) Notice: Subject to any disclaimer, the term of this patent is extended or adjusted under 35 U.S.C. 154(b) by 0 days.

(21) Appl. No.: 10/203,162

(22) PCT Filed: Feb. 11, 2000

(86) PCT No.: PCT/EP00/01133
§ 371 (c)(1),
(2), (4) Date: Aug. 6, 2002

(87) PCT Pub. No.: WO01/59932
PCT Pub. Date: Aug. 16, 2001

(51) Int. Cl.[7] .................................. H03M 1/06
(52) U.S. Cl. ......................... 341/118; 341/120
(58) Field of Search ................. 341/118, 120, 341/155; 330/149, 10, 151; 375/130

(56) References Cited

U.S. PATENT DOCUMENTS

| | | | | |
|---|---|---|---|---|
| 5,451,955 A | * | 9/1995 | Sullivan | 341/200 |
| 6,097,324 A | * | 8/2000 | Myer et al. | 341/118 |
| 6,271,780 B1 | * | 8/2001 | Gong et al. | 341/139 |
| 6,445,330 B1 | * | 9/2002 | Thomsen et al. | 341/172 |
| 6,473,013 B1 | * | 10/2002 | Velazquez et al. | 341/120 |
| 6,492,914 B2 | * | 12/2002 | Katoh | 341/50 |
| 6,515,599 B1 | * | 2/2003 | Kolsrud et al. | 341/118 |

FOREIGN PATENT DOCUMENTS

| | | |
|---|---|---|
| EP | 0 431 214 A | 6/1991 |
| EP | 0 475 376 A | 3/1992 |

* cited by examiner

*Primary Examiner*—Michael Tokar
*Assistant Examiner*—Linh V. Nguyen
(74) *Attorney, Agent, or Firm*—Venable LLP; Robert Kinberg

(57) ABSTRACT

With a method for converting an analog input signal (S1) to a digital output signal (S7), the analog input signal (S1) is amplified in a first signal path (2, 3, 5) and is subjected to an analog-to-digital conversion (5). In a second signal path (4, 6), another analog signal (S4) is obtained for transmitting larger signal amplitudes and is subjected to an analog-to-digital conversion (6). The signal (S5) digitized in the first signal path (2, 3, 5) and the signal (S6) that is digitized in the second signal path (4, 6) are fed to a digital signal processor (7), which generates the digital output signal (S7). To avoid an abrupt reduction in the signal resolution and achieve the highest possible dynamic scope, it is suggested that the analog signal fed to the second signal path (4, 5) be distorted non-linear and counter to the amplified analog signal (S2) in the first signal path (2, 3, 5). In this way, the differential amplification of the first signal path and the second signal path increases above a predetermined threshold and with rising signal amplitude. As a result, a non-distorted output signal (S7) is generated following the assembly of the distorted partial signals. (FIG. 2).

10 Claims, 2 Drawing Sheets

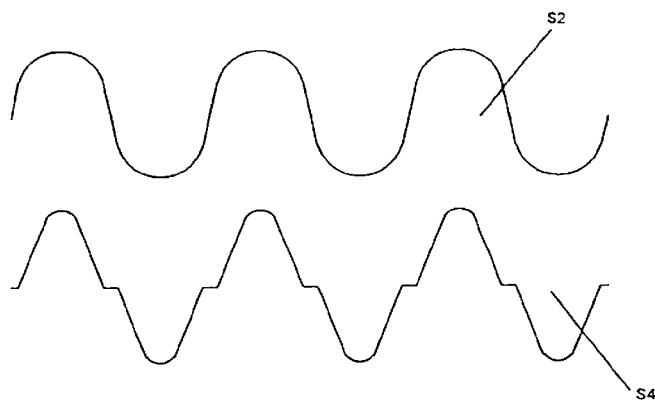
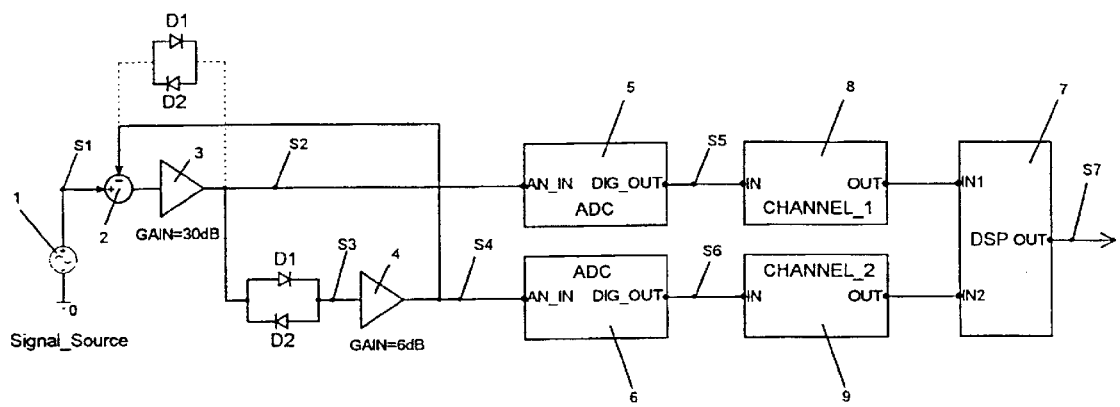
Fig.4
Fig.5

METHOD FOR CONVERTING AN ANALOG SIGNAL TO A DIGITAL SIGNAL

BACKGROUND OF THE INVENTION

The invention relates to a method in accordance with the preamble to patent claim 1. A method of this type is generally known.

So-called delta-sigma converters are preferably used for the high-resolution conversion of analog useful signals, especially in the audio range. These converters create a data flow with an extremely high pulse rate in a modulator control circuit, wherein the area content of the digital states of the digital output signal represents the analog information. Thus, the digital information is initially received in the time plane, wherein the achievable resolution of the useful signal represents a function of the pulse frequency. However, the pulse frequency cannot be selected optionally high since the inaccuracies of the signal pulse edges in the form of jitter and edge noise are entered directly into the useful information. By using the presently available technologies, a resolution of 24 bit and a dynamic (signal distance between noise and full scale) of approximately 117 dB (A-weighted) is achieved for delta-sigma converters. However, these values are approximately 15 to 25 dB below the dynamic data, which are required in the area of professional audio signal processing.

The practice of dividing the dynamic range to be mastered into several, preferably two, partial ranges, as shown in FIG. 1, is generally known for increasing the dynamic scope during the analog-to-digital conversion. FIG. 1 shows that the input signal S1 is transmitted in a first signal path via an adder 2 to an amplifier 3, in which low-level signals are analog amplified, for example by +30 dB. The amplified signal S2 is supplied in the first signal path to an analog-to-digital converter 5. The input signal S1 furthermore is supplied in a second signal path and without amplification to a second analog-to-digital converter 6. The two digitized signals S5 and S6 from the first signal path and the second signal path are then supplied to a digital signal processor 7 for further signal processing. At the output of this processor, the final digital output signal S7 is generated by assembling the signals S5 and S6.

With small signal amplitudes, which do not overdrive the amplifier 3 or the analog-to-digital converter 5 in the first signal path, the digital signal S5 is reduced with the aid of the digital signal processor 7 by the amplification of the amplifier 3 in order to generate the output signal S7. As a result, the digital noise from the analog-to-digital converter 5 is reduced by the same amount. The digital signal S5 that is reduced by the amplification of the amplifier 3 is then switched through as output signal S7 by the digital signal processor 7. In contrast, the digital signal S6 at the analog-to-digital converter 6 output remains turned off by the digital signal processor 7.

With larger signal amplitudes that can no longer be processed by the first analog-to-digital converter 5, the digital output signal S5 of this converter is turned off or blanked out with the digital signal processor 7. The digital output signal S6 from the analog-digital converter 6, which is obtained from the non-amplified input signal S1, is used by the digital signal processor 7 as output signal S7.

In order to avoid an undesirable overdriving of amplifier 3, a non-linear network can be connected in the negative feedback path of amplifier 3, for example in the form of back-to-back diodes D1, D2. As a result, the amplification of amplifier 3 is reduced for large signal amplitudes, which exceed the modulation range of the analog-to-digital converter 5 and are limited there.

The method explained with the aid of FIG. 1 is known in expert circles as "gain staging" and has, among other things, the following disadvantages:

The resolution of the useful information in the digital output signal S7 at the changeover point, during the takeover of the digitized signals S5, S6 from the first or second signal path changes abruptly. The changeover point typically is in the center of the dynamic operating range for the useful signal. This abrupt change in resolution above all affects audio programming signals where sounds with high and very low levels occur simultaneously.

The timely detection of the changeover point from the digitized useful signal that changes, specifically with higher-frequency signal shares, is a problem not least because of the extreme band-width delimitation due to principle of analog-to-digital converters.

The balancing accuracy with respect to amplification and time behavior between the analog and digital signal processing with complementary effect must be extremely high to avoid distortions.

The purposeful overdriving of the amplifier 3 in the first signal path poses high requirements. It should operate completely without delay, which is critical especially for the transition from an overdriven to the normal operational state.

Even if the purposeful overdriving of the amplifier 3 in the first signal path functions completely without problems, errors cannot be avoided at the moment of changeover from the signal S6 to the signal S5. This is due to the fact that the digital decimation filter in the analog-to-digital converter 5 contains erroneous data following an overdriving of the analog-to-digital converter 5 and does not start operating without problems until after a typical throughput time in the range of 0.5 to 1 ms.

Using a method of the aforementioned type, it is therefore the object of the invention to avoid an abrupt change in the signal resolution and in the switching operations for the useful signal. The object furthermore is to achieve a better use of the two signal paths, resulting in a higher or maximum possible signal resolution for larger signal amplitudes and thus an increased dynamic scope while, simultaneously, permitting an uncritical signal processing that is simple and error-free with respect to the digital post processing.

This object is solved with the characterizing features in claim 1.

SUMMARY OF THE INVENTION

Advantageous embodiments and modifications of the inventive method according to claim 1 follow from the dependent claims.

BRIEF DESCRIPTION OF THE DRAWINGS

The invention is explained in further detail with the aid of an exemplary embodiment shown in the drawings. Shown are in:

FIG. 4 Signal curves for complementary distorted signals in the first and second signal path of the circuit arrangement according to FIG. 2 or 3.

FIG. 5 A circuit diagram for another variant of a circuit arrangement for realizing the method according to the invention.

DETAILED DESCRIPTION OF THE INVENTION

Figure 1:
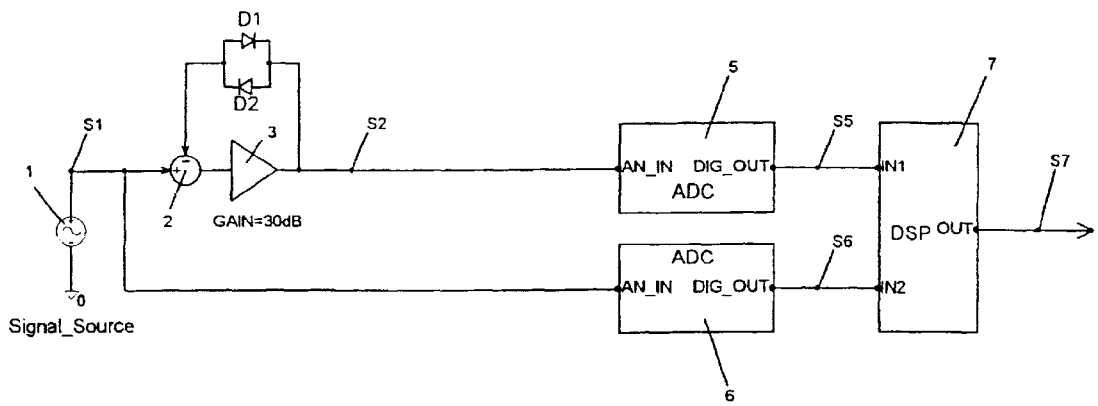
Figure 2:
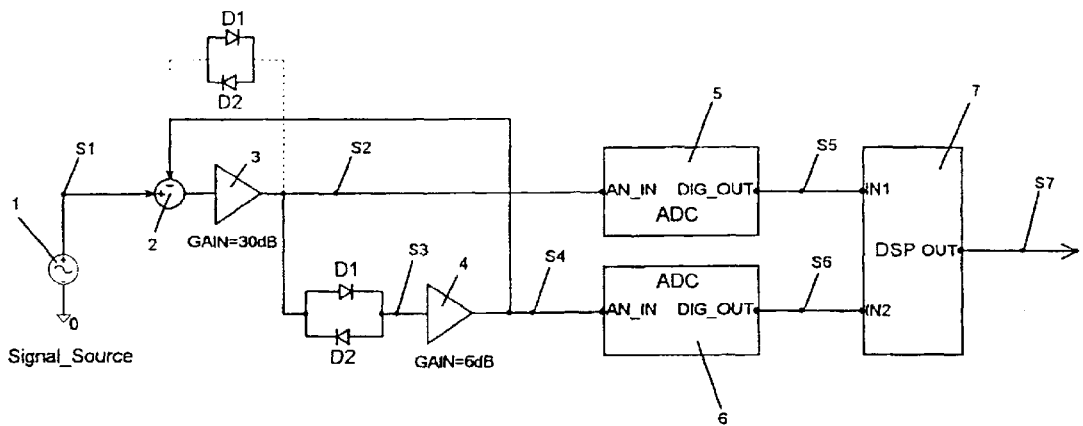
FIGS. 2, 3 Diagrams showing exemplary embodiments of a circuit arrangement for realizing the method according to the invention.

A first and a second signal path are provided for the circuit arrangement shown in FIG. 2 for realizing the method according to the invention, in the same way as for FIG. 1. The first signal path is configured in the same way as for the circuit arrangement according to FIG. 1, meaning it comprises an adder 2, an amplifier 3 and an analog-to-digital converter 5. The second signal path furthermore contains an analog-to-digital converter 6, wherein the digitized output signals S5 and S6 of the first analog-to-digital converter 5 and the second analog-to-digital converter 6 are fed to a digital signal processor 7, which then generates the desired digital output signal S7. The amplifier 3 in the first signal path also functions to raise small signal shares, which are still to be shown, above the noise level of the first analog-to-digital converter 5. For this, the signal shares that would overdrive the analog-to-digital converter 5 are previously amplified less with increasing amplitude, with the aid of a non-linear network D1, D2 in the negative feedback branch of the amplifier 3. As a result of the non-linear negative feedback, the output signal S2 of amplifier 3 has a distorted signal shape above a specific signal amplitude, which follows the logarithmic characteristic lines of the back-to-back diodes D1, D2 in the negative feedback branch.

The basic idea of the method realized with the circuit arrangement according to FIG. 2 is that the limited or distorted signal S2 at the output of amplifier 3 is viewed in the same way as if it had been generated through a linear interconnection or by adding two signals in the adder 2, namely the linear input signal S1 and a distorted signal S4. Thus, the resulting signal S2 is given a distorted signal form that is complementary to the distorted signal S4. The distorted signal S4 is generated in a manner to be described later on in the second signal path and is fed to the analog-to-digital converter 6 there. The digital signal processor 7 thus is fed two complementary distorted digital signals S5 and S6, which are assembled with the correct mathematical sign and the correct amplitude in the digital signal processor 7, meaning at the ratio of the selected amplification of amplifier 3. As a result, an undistorted digital output signal S7 is obtained at the output of signal processor 7. It is understood that the digital signal processor 7 can be replaced with optional digital circuit arrangements that operate in the same way.

The two back-to-back diodes D1 and D2 are provided in the second signal path for generating the distorted signal S4 for the exemplary embodiment. The amplified signal S2 at the output of amplifier 3 is fed to these two diodes, in the same way as for the back-to-back diodes D1 and D2 in the negative feedback branch of amplifier 3. The signal S3 that is distorted in the second signal path by the back-to-back diodes D1, D2, is switched to the input of an amplifier 4, which generates the distorted signal S4 at its output. As previously mentioned, the distorted signal S4 is fed in the first signal path to the analog-to-digital converter 6 as well as to the adder 2. The addition of the distorted signal S4 in the adder 2 to the linear input signal S1 occurs linear and with the correct mathematical sign within the meaning of a negative feedback. As a result, a closed control circuit is formed through the negative feedback of the distorted signal S4, which automatically results in generating the complementary distorted signals S3 and S4, which are distorted complementary to the signal S2. In order to balance the signal amplitude ratios between the complementary distorted signals S3 and S4, the amplification of the amplifier 4 is adjusted accordingly, for example to the amplification factor 2 (+6 dB).

The signal curves for the complementary distorted signals S2 and S4 are shown in FIG. 4 (purely qualitative, meaning without taking into consideration a possible scaling). From this, it can be seen that the signal S4 does not carry any information in the second signal path below the threshold voltage for the back-to-back diodes D1, D2. Thus, the corresponding digitized signal S6 at the output of the analog-to-digital converter 6 also does not contain any useful information, but only the internal noise. Processing the digitized signals S5, S6 in the digital signal processor 7 permits suppressing this internal noise with the complete absence of feedback by switching the digital signal S6 off for this case or not using it to generate the digital output signal S7.

The amplification of amplifier 3 can be selected optionally to lower the noise in the analog-to-digital converter 5 far enough below the noise of the analog input signal, so that no noise addition worth mentioning occurs between the analog and the digital noise. It follows from this that during the addition of the digital signals S5 and S6, the signal S5 is reduced by the amplification of amplifier 3 at the output of the analog-to-digital converter 5 by including the interfering digital noise components.

It is understood that the non-linear network installed in the second signal path in front of the input for amplifier 4 can also be realized in ways other than with back-to-back diodes. In any case, the non-linear network is completely uncritical with respect to the transmission characteristic and tolerances since the correct complementary distorted signal S3 is generated automatically through the linear feeding of the distorted signal S4 into the adder 2. With respect to the desired amplitude ratios between the signals S3 and S4, the generating of the distorted signal S4 from the signal S3 and the feeding of the signal S4 in the sense of a negative feedback into the adder 2 is positive because it creates the stabilizing effect of a closed control circuit.

Figure 3:
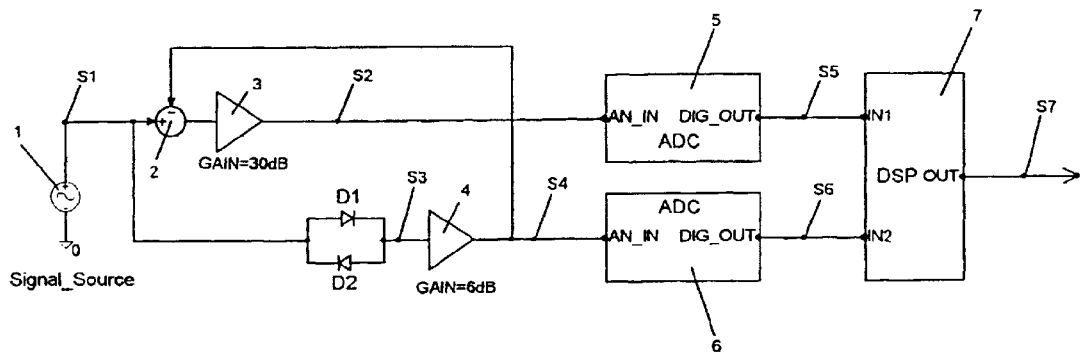

In principle, however, the method can also be realized in that the distorted signal S4 is obtained directly from the linear input signal S1. A circuit of this type is illustrated in FIG. 3. With this variant, the input signal S1 is fed directly to the non-linear network (e.g. back-to-back diodes D1, D2) in front of the amplifier 4.

On the whole, the method according to the invention has the following advantageous characteristics:

The high-resolution first signal path with the amplifier 3 and the analog-to-digital converter 5 is always active, meaning it is never shut down or blanked out and for that reason contributes at any moment to the generating of the digital output signal S7.

The resolution as measure for the differential amplification of the amplifier 3 is reduced, starting with the point in time at which the non-linear network becomes effective. For the exemplary embodiment shown in FIG. 2 or 3, it is reduced starting with the threshold voltage of the back-to-back diodes D1/D2. This reduction in resolution occurs with increasing amplitude slowly, continuously as well as automatically and only by the minimum degree necessary at any moment, so that no reduction in resolution or only a slight reduction occurs in the range of the normal operating dynamic. As a result, each point in the signal amplitude is transmitted with the theoretically possible resolution.

Even in the case of the modulation range limit, both signal paths contribute to illustrating the useful signal, which leads to higher resolution and lower total noise.

The switching of the digitized signal S6 at the output of the analog-to-digital converter 6 for suppressing the noise present there is non-critical or non-reactive since no useful signal is switched. The switching information can be obtained easily and on time from the two signal paths, preferably from the useful signal of the continuously active first signal path.

The assembly of the digitized signals S5, S6 in the digital signal processor 7 occurs purely with numbers and unadulterated by interpolation, which leads to insignificant distortions of the digital output signal S7. No fading algorithms, if applicable with interpolation character, are required for the digital signal processor 7.

No overdriving of the two analog-to-digital converters 5, 6 occurs over the complete dynamic range, so that the decimation filters in the analog-to-digital converters contain mathematically correct data at any point in time.

With the method according to the invention, it is basically possible to divide the input signal S1 into more than two signal paths, wherein the complementary distorted signal S4 is then formed from several partial signals, corresponding to the higher number of signal paths. These several partial signals, the sum of which corresponds to the distorted signal S4 or the complementary distorted component of signal S2, are fed to a corresponding number of analog-to-digital converters.

The partial signals are generated in the same way as the signal S4 for the circuit shown in FIG. 2 or 3, if necessary with a varying transmission characteristic for the non-linear networks for generating these partial signals.

As shown with the aid of FIG. 5, the method according to the invention can in general be used for a dynamic expansion for optional signal transmissions. In that case, optional transmission paths or storage mediums with naturally limited dynamic (=channels 8, 9) are provided between the analog-to-digital converters 5, 6 and the signal processor 7 on the receiving side. Of course, if the channels 8, 9 are provided with separate analog-to-digital converters, then the analog-to-digital converters 5, 6 can be omitted. The transmission characteristic of the individual channels 8, 9 plays no role in that case, as long as both channels 8, 9 exhibit primarily the same type of behavior.

What is claimed is:

1. A method for converting an analog input signal to a digital output signal, the method comprising the steps of:

obtaining first and second analog sub-signals from the analog input signal;

distorting the second analog sub-signal such that the second analog sub-signal contains substantially no useful information from the analog input signal below a threshold level;

adding the second analog sub-signal to the analog input signal to form the first analog sub-signal, the added second sub-signal having a polarity such that the first analog sub-signal comprises a signal shape which is complementarily distorted with respect to the second analog sub-signal;

subjecting each of the first and second analog sub-signals to an analog-to-digital conversion to form first and second digitized sub-signals, respectively; and applying the first and second digitized sub-signals to a digital signal processor to form the digital output signal therewith, wherein the applying the first and second digitized sub-signals comprises cutting off the second digitized sub-signal in the digital signal processor and not utilizing the second digitized sub-signal in forming the digital output signal when the second digitized sub-signal has no useful information from the analog input signal.

2. The method according to claim 1, wherein the distorting the second analog sub-signal comprises distorting the second analog sub-signal with a network having a non-linear transmission characteristic.

3. The method according to claim 2, further comprising a step of feeding the analog input signal to the network having a non-linear transmission characteristic and to back-to-back diodes.

4. The method according to claim 1, wherein distorting the second analog sub-signal comprises a step of distorting the second analog sub-signal with back-to-back diodes.

5. The method according to claims 4, further comprising a step of feeding the first analog sub-signal to the back-to-back diodes.

6. The method according to claim 1, wherein the step of adding the second analog sub-signal to the analog input signal comprises a step of adding the second analog sub-signal having the polarity and an amplitude that are based on amplifications of the first and second analog sub-signals.

7. The method according to claim 1, wherein the step of cutting off the second digitized sub-signal in the digital signal processor comprises comparing the second digitized sub-signal with a reference value.

8. The method according to claim 1, wherein the step of cutting off the second digitized sub-signal in the digital signal processor comprises comparing the first digitized sub-signal with a reference value.

9. The method according to claim 1, further comprising a step of transferring the first and second digitized sub-signals along signal transfer paths and feeding the transferred first and second digitized sub-signals to the digital signal processor.

10. The method according to claim 1, further comprising a step of feeding the first and second digitized sub-signals to a storage media, reading out the first and second digitized sub-signals from the storage media, and feeding the read-out first and second digitized sub-signals to the digital signal processor.

* * * * *